(12) United States Patent
Sagawa et al.

(10) Patent No.: US 9,453,158 B2
(45) Date of Patent: Sep. 27, 2016

(54) CURABLE SILICONE COMPOSITION, CURED PRODUCT THEREOF, AND OPTICAL SEMICONDUCTOR DEVICE

(71) Applicant: Dow Corning Toray Co., Ltd., Tokyo (JP)

(72) Inventors: Takashi Sagawa, Ichihara (JP); Masaaki Amako, Ichihara (JP); Maki Itoh, Ichihara (JP); Michitaka Suto, Ichihara (JP); Tomohiro Iimura, Ichihara (JP)

(73) Assignee: DOW CORNING TORAY CO. LTD., Tokyo (JP)

( * ) Notice: Subject to any disclaimer, the term of this patent is extended or adjusted under 35 U.S.C. 154(b) by 0 days.

(21) Appl. No.: 14/767,717

(22) PCT Filed: Feb. 13, 2014

(86) PCT No.: PCT/JP2014/053959
§ 371 (c)(1),
(2) Date: Aug. 13, 2015

(87) PCT Pub. No.: WO2014/126265
PCT Pub. Date: Aug. 21, 2014

(65) Prior Publication Data
US 2015/0368554 A1    Dec. 24, 2015

(30) Foreign Application Priority Data

Feb. 15, 2013   (JP) ................................. 2013-027857

(51) Int. Cl.
*H01L 33/56*   (2010.01)
*C09K 11/02*   (2006.01)
(Continued)

(52) U.S. Cl.
CPC ............. *C09K 11/025* (2013.01); *C08L 83/04* (2013.01); *C09D 183/04* (2013.01); *C09J 183/04* (2013.01);
(Continued)

(58) Field of Classification Search
CPC .. C09K 11/025; C09D 183/04; C09J 183/04; H01L 33/502; H01L 33/56
USPC ........................................................... 257/98
See application file for complete search history.

(56) References Cited

U.S. PATENT DOCUMENTS 7,569,989 B2    8/2009  Nitta et al.
2006/0081864 A1  4/2006  Nakazawa
(Continued)

FOREIGN PATENT DOCUMENTS

EP       2730620 A1     5/2014
JP    2002314142 A    10/2002
(Continued)

OTHER PUBLICATIONS

English language abstract for JP 2002-314142 extracted from espacenet.com database on Aug. 18, 2015, 2 pages.
(Continued)

*Primary Examiner* — Asok K Sarkar
*Assistant Examiner* — Dmitriy Yemelyanov
(74) *Attorney, Agent, or Firm* — Howard & Howard Attorneys PLLC

(57) ABSTRACT

The present invention relates to a curable silicone composition comprising: (A) an organopolysiloxane having at least two alkenyl groups in a molecule; (B) an organopolysiloxane represented by a general formula; (C) an organopolysiloxane having at least two silicon-bonded hydrogen atoms in a molecule; (D) a phosphor; and (E) a hydrosilylation reaction catalyst, to a cured product obtained by curing said composition, and to an optical semiconductor device in which a light emitting element is sealed or coated with a cured product of the aforementioned composition. The curable silicone composition has excellent fluidity and cures to form a cured product in which phosphors are homogeneously dispersed and which has a high refractive index.

15 Claims, 1 Drawing Sheet

(51) Int. Cl.
  *C08L 83/04*   (2006.01)
  *C09D 183/04*  (2006.01)
  *C09J 183/04*  (2006.01)
  *H01L 33/50*   (2010.01)
  *C08G 77/12*   (2006.01)
  *C08G 77/20*   (2006.01)
  *C08G 77/00*   (2006.01)

(52) U.S. Cl.
  CPC ............ *H01L 33/502* (2013.01); *H01L 33/56* (2013.01); *C08G 77/12* (2013.01); *C08G 77/20* (2013.01); *C08G 77/80* (2013.01); *H01L 2224/48091* (2013.01); *H01L 2224/48247* (2013.01); *H01L 2224/73265* (2013.01)

(56) References Cited

U.S. PATENT DOCUMENTS

2011/0254047 A1* 10/2011 Yoshitake ............... C08L 83/04
                                                      257/100

2014/0191161 A1   7/2014 Amako et al.

FOREIGN PATENT DOCUMENTS

| JP | 2004359756 A | 12/2004 |
| JP | 2011222718 A | 11/2011 |
| WO | WO 2012078582 A1 | 6/2012 |
| WO | WO 2013005858 A1 | 1/2013 |

OTHER PUBLICATIONS

English language abstract for JP 2004-359756 extracted from espacenet.com database on Aug. 18, 2015, 2 pages.

English language abstract and machine-assisted English translation for JP 2011-222718 extracted from espacenet.com database on Aug. 18, 2015, 24 pages.

English language abstract for WO 2013005858 extracted from espacenet.com database on Aug. 18, 2015, 2 pages.

International Search Report for Application No. PCT/JP2014/053959 dated Jun. 3, 2014, 3 pages.

* cited by examiner

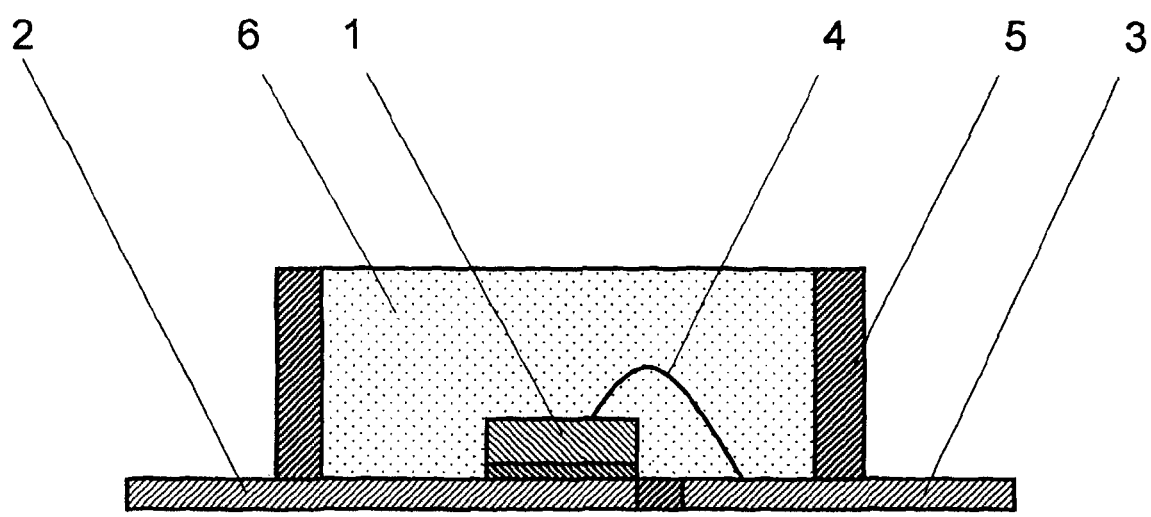

CURABLE SILICONE COMPOSITION, CURED PRODUCT THEREOF, AND OPTICAL SEMICONDUCTOR DEVICE

RELATED APPLICATIONS

This application is the National Stage of International Patent Application No. PCT/JP2014/053959, filed on Feb. 13, 2014, which claims priority to and all the advantages of Japanese Patent Application No. 2013-027857, filed on Feb. 15, 2013, the content of which is incorporated herein by reference.

TECHNICAL FIELD

The present invention relates to a curable silicone composition, a cured product formed by curing the composition, and an optical semiconductor device produced using the composition.

BACKGROUND ART

In order to obtain light of a desired wavelength by altering the wavelength of light emitted from a light emitting element in an optical semiconductor device such as a light emitting diode (LED), sealing or coating the aforementioned light emitting element by means of a curable silicone composition that contains a phosphor is a known technique (see Japanese Unexamined Patent Application Publication Nos. 2002-314142 and 2004-359756).

However, curable silicone compositions that contain phosphors are such that the phosphor can precipitate and separate during storage and the phosphor can precipitate and separate due to the viscosity of the composition being lowered when the composition is cured by heating, meaning that the obtained optical semiconductor device can suffer from problems such as color unevenness or chromatic shifts. As a result, a proposal has been made to additionally use nanoparticles in order to suppress precipitation and separation of a phosphor in a curable silicone composition (see Japanese Unexamined Patent Application Publication No. 2011-222718).

However, curable silicone compositions that contain both phosphors and nanoparticles exhibit a significant reduction in fluidity, meaning that problems can occur, such as variations in discharge amount during potting and sealing or coating of a light emitting element being unsatisfactory.

An objective of the present invention is to provide a curable silicone composition which has excellent fluidity and which is cured to form a cured product in which phosphors are homogeneously dispersed and which has a high refractive index. In addition, another objective of the present invention is to provide a cured product in which phosphors are homogeneously dispersed and which has a high refractive index and to provide an optical semiconductor device having little color unevenness or chromatic shift.

DISCLOSURE OF INVENTION

The curable silicone composition of the present invention comprises:
(A) an organopolysiloxane having at least two alkenyl groups in a molecule, and excluding component (B) mentioned below;
(B) an organopolysiloxane represented by the general formula:

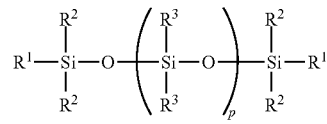

wherein, $R^1$ are the same or different and are each an alkenyl group having from 2 to 12 carbons, $R^2$ are the same or different and are each an aryl group having from 6 to 20 carbons or an aralkyl group having from 7 to 20 carbons, $R^3$ are the same or different and are each an alkyl group having from 1 to 12 carbons, and p is an integer from 1 to 100;
(C) an organopolysiloxane having at least two silicon-bonded hydrogen atoms in a molecule, in an amount that the amount of silicon-bonded hydrogen atoms in component (C) is from 0.1 to 5 moles per 1 mol of total alkenyl groups in components (A) and (B);
(D) a phosphor; and
(E) an effective amount of a hydrosilylation reaction catalyst;
wherein the content of component (A) is from 20 to 80 mass %, the content of component (B) is from 0.1 to 20 mass % and the content of component (D) is from 0.1 to 70 mass %, each relative to the total amount of components (A) to (E).

The cured product of the present invention is formed by curing the curable silicone composition described above.

The optical semiconductor device of the present invention is characterized in that a light emitting element is sealed or coated with a cured product of the above-mentioned curable silicone composition.

EFFECTS OF INVENTION

The curable silicone composition of the present invention is characterized by having excellent fluidity and by being cured to form a cured product in which phosphors are homogeneously dispersed and which has a high refractive index. In addition, the cured product of the present invention is characterized by having phosphors homogeneously dispersed therein and by having a high refractive index. Furthermore, the optical semiconductor device of the present invention is characterized by having little color unevenness or chromatic shift.

BRIEF DESCRIPTION OF THE DRAWINGS

FIG. 1 is a cross-sectional view of an LED serving as an example of the optical semiconductor device of the present invention.

DETAILED DESCRIPTION OF THE INVENTION

First, a curable silicone composition of the present invention will be described in detail.

Component (A) is a main component of the present composition and is an organopolysiloxane having at least two alkenyl groups in a molecule. Examples of the alkenyl groups in component (A) include alkenyl groups having from 2 to 12 carbons such as vinyl groups, allyl groups, butenyl groups, pentenyl groups, hexenyl groups, heptenyl groups, octenyl groups, nonenyl groups, decenyl groups, undecenyl groups, and dodecenyl groups, with vinyl groups being preferred. In addition, examples of groups other than alkenyl groups bonded to silicon atoms in component (A)

include alkyl groups having from 1 to 12 carbons, aryl groups having from 6 to 20 carbons, and aralkyl groups having from 7 to 20 carbons. Examples of alkyl groups include methyl groups, ethyl groups, propyl groups, butyl groups, pentyl groups, hexyl groups, heptyl groups, octyl groups, nonyl groups, decyl groups, undecyl groups, and dodecyl groups, with methyl groups being preferred. Examples of aryl groups include phenyl groups, tolyl groups, xylyl groups, naphthyl groups, anthracenyl groups, phenanthryl groups, pyrenyl groups, and groups obtained by substituting hydrogen atoms in these aryl groups with alkyl groups such as methyl groups or ethyl groups; alkoxy groups such as methoxy groups or ethoxy groups; and halogen atoms such as chlorine atoms or bromine atoms, with phenyl groups and naphthyl groups being preferred. In addition, examples of aralkyl groups include benzyl groups, phenethyl groups, naphthyl ethyl groups, naphthyl propyl groups, anthracenyl ethyl groups, phenanthryl ethyl groups, pyrenyl ethyl groups, and groups obtained by substituting hydrogen atoms in these aralkyl groups with alkyl groups such as methyl groups or ethyl groups; alkoxy groups such as methoxy groups or ethoxy groups; and halogen atoms such as chlorine atoms or bromine atoms.

The molecular structure of this type of component (A) can be straight, partially branched straight, branched chain, resinoid, or the like, and may be a mixture of two or more types of these molecular structures.

An example of this type of component (A) is ($A_1$) an organopolysiloxane which has at least two alkenyl groups in a molecule and which is represented by the average unit formula:

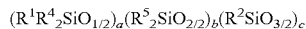

$$(R^1R^4{}_2SiO_{1/2})_a(R^5{}_2SiO_{2/2})_b(R^2SiO_{3/2})_c$$

In the formula, $R^1$ is an alkenyl group having from 2 to 12 carbons, examples of which include vinyl groups, allyl groups, butenyl groups, pentenyl groups, hexenyl groups, heptenyl groups, octenyl groups, nonenyl groups, decenyl groups, undecenyl groups, and dodecenyl groups, and is preferably a vinyl group.

In the formula, $R^2$ is an aryl group having from 6 to 20 carbons or an aralkyl group having from 7 to 20 carbons. Examples of the aryl groups for $R^2$ include phenyl groups, tolyl groups, xylyl groups, naphthyl groups, anthracenyl groups, phenanthryl groups, pyrenyl groups, and groups in which the hydrogen atoms of these aryl groups are substituted with alkyl groups such as methyl groups and ethyl groups; alkoxy groups such as methoxy groups and ethoxy groups; or halogen atoms such as chlorine atoms and bromine atoms. Of these, phenyl groups and naphthyl groups are preferable. Examples of the aralkyl groups for $R^2$ include benzyl groups, phenethyl groups, naphthyl ethyl groups, naphthyl propyl groups, anthracenyl ethyl groups, phenanthryl ethyl groups, pyrenyl ethyl groups, and groups in which the hydrogen atoms of these aralkyl groups are substituted with alkyl groups such as methyl groups and ethyl groups; alkoxy groups such as methoxy groups and ethoxy groups; or halogen atoms such as chlorine atoms and bromine atoms.

In the formula, $R^4$ are the same or different, and are each an alkyl group having from 1 to 12 carbons, an alkenyl group having from 2 to 12 carbons, an aryl group having from 6 to 20 carbons, or an aralkyl group having from 0.7 to 20 carbons. Examples of the alkyl groups for $R^4$ include methyl groups, ethyl groups, propyl groups, butyl groups, pentyl groups, hexyl groups, heptyl groups, octyl groups, nonyl groups, decyl groups, undecyl groups, and dodecyl groups. Of these, methyl groups are preferable. Examples of the alkenyl group for $R^4$ include the same groups described for $R^1$. Of these, a vinyl group is preferable. Examples of the aryl groups for $R^4$ include phenyl groups, tolyl groups, xylyl groups, naphthyl groups, anthracenyl groups, phenanthryl groups, pyrenyl groups, and groups in which the hydrogen atoms of these aryl groups are substituted with alkyl groups such as methyl groups and ethyl groups; alkoxy groups such as methoxy groups and ethoxy groups; or halogen atoms such as chlorine atoms and bromine atoms. Of these, phenyl groups and naphthyl groups are preferable. Examples of the aralkyl groups for $R^4$ include benzyl groups, phenethyl groups, naphthyl ethyl groups, naphthyl propyl groups, anthracenyl ethyl groups, phenanthryl ethyl groups, pyrenyl ethyl groups, and groups in which the hydrogen atoms of these aralkyl groups are substituted with alkyl groups such as methyl groups and ethyl groups; alkoxy groups such as methoxy groups and ethoxy groups; or halogen atoms such as chlorine atoms and bromine atoms.

In the formula, $R^5$ are the same or different and are each an alkyl group having from 1 to 12 carbons, an alkenyl group having from 2 to 12 carbons or a phenyl group. Examples of the alkyl group for $R^5$ include the same alkyl groups described for $R^4$, and the alkyl group is preferably a methyl group. Examples of the alkenyl group for $R^5$ include the same groups described for $R^1$. Of these, a vinyl group is preferable.

In the formula, a, b, and c are respectively numbers satisfying: $0.01 \leq a \leq 0.5$, $0 \leq b \leq 0.7$, $0.1 \leq c < 0.9$, and $a+b+c=1$, preferably numbers satisfying: $0.05 \leq a \leq 0.45$, $0 \leq b \leq 0.5$, $0.4 \leq c < 0.85$, and $a+b+c=1$, and even more preferably numbers satisfying: $0.05 \leq a \leq 0.4$, $0 \leq b \leq 0.4$, $0.45 \leq c < 0.8$, and $a+b+c=1$. This is because the gas permeability of the cured product is reduced if the value of a is not less than the lower limit of the above-mentioned range and stickiness hardly occurs in the cured product if the value of a is not more than the upper limit of the above-mentioned range. This is also because the hardness of the cured product is favorable and the reliability is improved when the value of b is less than or equal to the upper limit of the range described above. This is also because the refractive index of the cured product is favorable when the value of c is greater than or equal to the lower limit of the range described above, and the mechanical characteristics of the cured product are improved when the value of c is less than or equal to the upper limit of the range described above.

Component ($A_1$) is represented by the average unit formula described above but may also have siloxane units represented by the formula: $R^6{}_3SiO_{1/2}$, siloxane units represented by the formula: $R^7SiO_{3/2}$, or siloxane units represented by the formula: $SiO_{4/2}$ within a range that does not diminish the object of the present invention. In the formula, $R^6$ are the same or different and are each an alkyl group having from 1 to 12 carbons, an aryl group having from 6 to 20 carbons, or an aralkyl group having from 7 to 20 carbons. Examples of the alkyl group for $R^6$ include the same alkyl groups described for $R^3$. Examples of the aryl group for $R^6$ include the same aryl groups described for $R^2$. Examples of the aralkyl group for $R^6$ include the same aralkyl groups described for $R^2$. In the formula, $R^7$ is an alkyl group having from 1 to 12 carbons or an alkenyl group having from 2 to 12 carbons. Examples of the alkyl group for $R^7$ include the same alkyl groups described for $R^3$. Examples of the alkenyl group for $R^7$ include the same groups described for $R^1$. Furthermore, component (A) may contain silicon-bonded alkoxy groups, such as methoxy groups, ethoxy groups, or propoxy groups, or silicon-bonded hydroxyl groups as long as the objective of the present invention is not impaired.

Component (A) may be a mixture of the aforementioned component (A$_1$) and (A$_2$) an organopolysiloxane represented by the general formula:

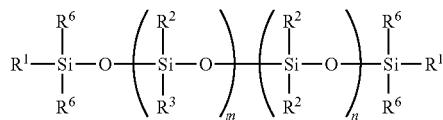

In the formula, R$^1$ are the same or different and are each an alkenyl group having from 2 to 12 carbons, examples of which are synonymous with the groups described above, and vinyl groups are preferred.

In the formula, R$^2$ are the same or different and are each an aryl group having from 6 to 20 carbons or an aralkyl group having from 7 to 20 carbons, examples of which are synonymous with the groups described above, and are preferably phenyl groups or naphthyl groups.

In the formula, R$^3$ is an alkyl group having from 1 to 12 carbons, examples of which are synonymous with the groups described above, and is preferably a methyl group.

In the formula, R$^6$ are the same or different and are each an alkyl group having from 1 to 12 carbons, an aryl group having from 6 to 20 carbons or an aralkyl group having from 7 to 20 carbons, examples of which are synonymous with the groups described above, and are preferably methyl groups, vinyl groups, phenyl groups, or naphthyl groups.

In the formula, m is an integer from 1 to 100 and n is an integer from 0 to 50, where m≥n and 1≤m+n≤100. Preferably, m is an integer from 1 to 75 and n is an integer from 0 to 25, where m≥n and 1≤m+n≤75, and more preferably, m is an integer from 1 to 50 and n is an integer from 0 to 25, where m≥n and 1≤m+n≤50. This is because when the value of m is greater than or equal to the lower limit of the aforementioned range, the refractive index of the cured product becomes high, and when the value of m is less than or equal to the upper limit of the aforementioned range, the handlability of the composition is improved.

Component (A$_2$) is represented by the general formula described above, but may also have silicon-bonded alkoxy groups, such as methoxy groups, ethoxy groups, or propoxy groups, or silicon-bonded hydroxyl groups within a range that does not impair the objective of the present invention.

Examples of this type of component (A$_2$) include organopolysiloxanes such as those mentioned below. Moreover, in the formulae, Me, Vi, and Ph denote methyl groups, vinyl groups and phenyl groups respectively, m' is an integer from 1 to 100, and n' is an integer from 1 to 50, where m'≥n' and m'+n'≤100.

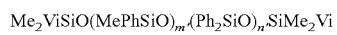

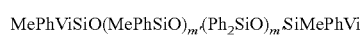

In the present composition, the content of component (A$_2$) is preferably at most 50 mass %, and more preferably at most 30 mass %, relative to the total amount of components (A) to (E). This is because the mechanical characteristics of the cured product are good if the content of component (A$_2$) is less than or equal to the upper limit of the range mentioned above. In addition, the content of component (A$_2$) is preferably at least 5 mass % relative to the total amount of components (A) to (E). This is because the flexibility of the cured product is improved if the content of component (A$_2$) is greater than or equal to the lower limit of the above-mentioned range.

Component (B) is an organopolysiloxane which acts as a dispersing agent for a phosphor and which is represented by the general formula:

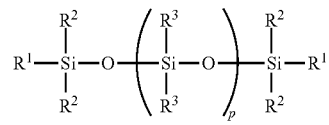

This type of component (B) contributes to a smoothing of the surface of a cured product obtained by curing the present composition and contributes to suppressing color unevenness and chromatic shifts in an optical semiconductor device.

In the formula, R$^1$ are the same or different and are each an alkenyl group having from 2 to 12 carbons, examples of which are synonymous with the groups described above, and are preferably vinyl groups.

In the formula, R$^2$ are the same or different and are each an aryl group having from 6 to 20 carbons or an aralkyl group having from 7 to 20 carbons, examples of which are synonymous with the groups described above, and are preferably phenyl groups or naphthyl groups.

In the formula, R$^3$ are the same or different and are each an alkyl group having from 1 to 12 carbons, examples of which are synonymous with the groups described above, and are preferably methyl groups.

In the formula, p is an integer from 1 to 100, preferably an integer from 1 to 50, and more preferably an integer from 1 to 20. This is because the dispersibility of the phosphors in the present composition is good if the value of p is not less than the lower limit of the above-mentioned range and the transparency of the composition is improved if the value of p is not greater than the upper limit of the above-mentioned range.

Component (B) is represented by the above-mentioned general formula, but may also have silicon-bonded alkoxy groups, such as methoxy groups, ethoxy groups or propoxy groups, methylphenylsiloxy units, diphenylsiloxy units, T units having alkyl groups having from 1 to 12 carbons, aryl groups or aralkyl groups, or silicon-bonded hydroxyl groups within a range that does not impair the objective of the present invention.

Examples of this type of component (B) include organopolysiloxanes such as those mentioned below. Moreover, in the formula, Me, Vi, and Ph denote a methyl group, a vinyl group, and a phenyl group respectively, p' is an integer from 1 to 100 and q' is an integer from 1 to 50, where p'≥q' and p'+q'≤100.

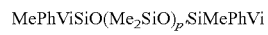

In the present composition, the content of component (B) is within a range from 0.1 to 20 mass %, and preferably within a range from 0.1 to 15 mass %, relative to the total amount of components (A) to (E). This is because it is possible to impart the dispersibility of the phosphors to the silicone cured product and it is easy to smooth the surface of a cured product obtained by curing the present composition if the content of component (B) is not less than the lower limit of the above-mentioned range and the transparency of the cured product is good if the content of component (B) is not greater than the upper limit of the above-mentioned range.

Component (C) is a crosslinking agent of the present composition and is an organopolysiloxane having at least two silicon-bonded hydrogen atoms in a molecule. Examples of groups other than hydrogen atoms bonded to silicon atoms in component (C) include alkyl groups having from 1 to 12 carbons, aryl groups having from 6 to 20 carbons, and aralkyl groups having from 7 to 20 carbons. Examples of alkyl groups include methyl groups, ethyl groups, propyl groups, butyl groups, pentyl groups, hexyl groups, heptyl groups, octyl groups, nonyl groups, decyl groups, undecyl groups, and dodecyl groups, with methyl groups being preferred. Examples of aryl groups include phenyl groups, tolyl groups, xylyl groups, naphthyl groups, anthracenyl groups, phenanthryl groups, pyrenyl groups, and groups obtained by substituting hydrogen atoms in these aryl groups with alkyl groups such as methyl groups or ethyl groups; alkoxy groups such as methoxy groups or ethoxy groups; and halogen atoms such as chlorine atoms or bromine atoms, with phenyl groups and naphthyl groups being preferred. In addition, examples of aralkyl groups include benzyl groups, phenethyl groups, naphthyl ethyl groups, naphthyl propyl groups, anthracenyl ethyl groups, phenanthryl ethyl groups, pyrenyl ethyl groups, and groups obtained by substituting hydrogen atoms in these aralkyl groups with alkyl groups such as methyl groups or ethyl groups; alkoxy groups such as methoxy groups or ethoxy groups; and halogen atoms such as chlorine atoms or bromine atoms.

The molecular structure of this type of component (C) can be straight, partially branched straight, branched chain, resinoid, or the like, and may be a mixture of two or more types of these molecular structures.

This type of component (C) is preferably ($C_1$) an organosiloxane represented by the general formula:

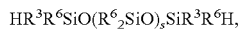
$HR^3R^6SiO(R^6{}_2SiO)_sSiR^3R^6H$, ($C_2$) an organopolysiloxane represented by the average unit formula:

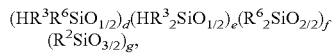
$(HR^3R^6SiO_{1/2})_d(HR^3{}_2SiO_{1/2})_e(R^6{}_2SiO_{2/2})_f(R^2SiO_{3/2})_g$, or a mixture of components ($C_1$) and ($C_2$).

In component ($C_1$), $R^3$ in the formula are the same or different, are each an alkyl group having from 1 to 12 carbons, examples of which are synonymous with the groups described above, and are preferably methyl groups.

In addition, in component ($C_1$), $R^6$ in the formula are the same or different, are each an alkyl group having from 1 to 12 carbons, an aryl group having from 6 to 20 carbons, or an aralkyl group having from 7 to 20 carbons, examples of which are synonymous with the groups described above, and are preferably methyl groups, phenyl groups, or naphthyl groups. It is particularly preferable for at least one $R^6$ in component ($C_1$) to be a phenyl group or a naphthyl group.

In addition, in component ($C_1$), s in the formula is an integer from 0 to 100, and in order for the handling and processability of the present composition to be excellent, is preferably an integer from 0 to 30, and more preferably an integer from 0 to 10.

Examples of this type of component ($C_1$) include organosiloxanes such as those mentioned below. Moreover, Me, Ph, and Naph in the formula denote a methyl group, a phenyl group, and a naphthyl group, respectively, s' is an integer from 1 to 100 and s" and s'" are each an integer of 1 or higher, but the sum of s"+s'" is an integer of 100 or lower.

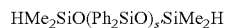
$HMe_2SiO(Ph_2SiO)_{s'}SiMe_2H$

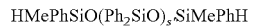
$HMePhSiO(Ph_2SiO)_{s'}SiMePhH$

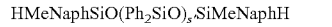
$HMeNaphSiO(Ph_2SiO)_{s'}SiMeNaphH$

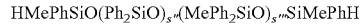
$HMePhSiO(Ph_2SiO)_{s''}(MePh_2SiO)_{s'''}SiMePhH$

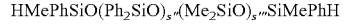
$HMePhSiO(Ph_2SiO)_{s''}(Me_2SiO)_{s'''}SiMePhH$

In addition, in component ($C_2$), $R^2$ in the formula is an aryl group having from 6 to 20 carbons or an aralkyl group having from 7 to 20 carbons, examples of which are synonymous with the groups described above, and is preferably a phenyl group or a naphthyl group.

In addition, in component ($C_2$), $R^3$ in the formula are the same or different, are each an alkyl group having from 1 to 12 carbons, examples of which are synonymous with the groups described above, and are preferably methyl groups.

In addition, in component ($C_2$), $R^6$ in the formula are the same or different, are each an alkyl group having from 1 to 12 carbons, an aryl group having from 6 to 20 carbons, or an aralkyl group having from 7 to 20 carbons, examples of which are synonymous with the groups described above, and are preferably methyl groups, phenyl groups, or naphthyl groups.

In addition, in component ($C_2$); d, e, f, and g in the formula are numbers that satisfy such that $0.1 \leq d \leq 0.7$, $0 \leq e \leq 0.5$, $0 \leq f \leq 0.7$, $0.1 \leq g < 0.9$, and $d+e+f+g=1$, and preferably such that $0.2 \leq d \leq 0.7$, $0 \leq e \leq 0.4$, $0 \leq f \leq 0.5$, $0.25 \leq g < 0.7$, and $d+e+f+g=1$. This is because the gas permeability of the cured product is reduced if the value of d is not less than the lower limit of the above-mentioned range and the cured product has an appropriate hardness if the value of d is not more than the upper limit of the above-mentioned range. In addition, the refractive index of the cured product is improved if the value of e is not more than the upper limit of the above-mentioned range. In addition, the cured product has an appropriate hardness and the reliability of an optical semiconductor device prepared using the present composition is improved if the value of f is not more than the upper limit of the above-mentioned range. In addition, the refractive index of the cured product is increased if the value of g is not less than the lower limit of the above-mentioned range and the mechanical strength of the cured product is improved if the value of g is not more than the upper limit of the above-mentioned range.

The molecular weight of this type of component ($C_2$) is not particularly limited, but from the perspectives of the handling/workability of the composition and the mechanical strength of the cured product, the mass average molecular weight in terms of standard polystyrene, as measured by gel permeation chromatography, is preferably from 500 to 10,000, and more preferably from 500 to 2,000.

Examples of this type of component ($C_2$) include organopolysiloxanes such as those mentioned below. Moreover, Me, Ph, and Naph in the formulae below denote a methyl group, a phenyl group, and a naphthyl group respectively, and d, e', f, and g are numbers that satisfy such that $0.1 \leq d \leq 0.7$, $0 < e' \leq 0.5$, $0 < f \leq 0.7$, $0.1 \leq g < 0.9$, and $d+e'++g=1$.

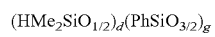
$(HMe_2SiO_{1/2})_d(PhSiO_{3/2})_g$

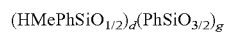
$(HMePhSiO_{1/2})_d(PhSiO_{3/2})_g$ $(HMePhSiO_{1/2})_d(NaphSiO_{3/2})_g$ $(HMe_2SiO_{1/2})_d(NaphSiO_{3/2})_g$ $(HMePhSiO_{1/2})_d(HMe_2SiO_{1/2})_e(PhSiO_{3/2})_g$ $(HMe_2SiO_{1/2})_d(Ph_2SiO_{2/2})_f(PhSiO_{3/2})_g$ $(HMePhSiO_{1/2})_d(Ph_2SiO_{2/2})_f(PhSiO_{3/2})_g$ $(HMe_2SiO_{1/2})_d(Ph_2SiO_{2/2})_f(NaphSiO_{3/2})_g$ $(HMePhSiO_{1/2})_d(Ph_2SiO_{2/2})_f(NaphSiO_{3/2})_g$ $(HMePhSiO_{1/2})_d(HMe_2SiO_{1/2})_e(NaphSiO_{3/2})_g$ $(HMePhSiO_{1/2})_d(HMe_2SiO_{1/2})_e(Ph_2SiO_{2/2})_f(NaphSiO_{3/2})_g$ $(HMePhSiO_{1/2})_d(HMe_2SiO_{1/2})_e(Ph_2SiO_{2/2})_f(PhSiO_{3/2})_g$ Component (C) can be the above-mentioned component ($C_1$), the above-mentioned component ($C_2$), or a mixture of the above-mentioned component ($C_1$) and the above-mentioned component ($C_2$). In cases where a mixture of the above-mentioned component ($C_1$) and the above-mentioned component ($C_2$) is used, the mixing ratio is not particularly limited, but it is preferable for the ratio of mass of the above-mentioned component ($C_1$): mass of the above-mentioned component ($C_2$) to be from 0.5:9.5 to 9.5:0.5.

The content of component (C) in the present composition, per 1 mol of total alkenyl groups in components (A) and (B), is in a range such that the silicon atom-bonded hydrogen atoms in component (C) is in a range from 0.1 to 5 mol, and preferably in a range from 0.5 to 2 mol. This is because when the content of component (C) is greater than or equal to the lower limit of the range described above, the composition is cured sufficiently, and when the content is less than or equal to the upper limit of the range described above, the heat resistance of the cured product is improved, thus making it possible to improve the reliability of an optical semiconductor device produced using this composition.

Component (D) is a phosphor that is used to obtain light of a desired wavelength by altering the wavelength of light emitted from a light emitting element that is sealed or coated with the cured product of the present composition. Examples of this type of component (D) include yellow, red, green, and blue light emitting phosphors consisting of oxide phosphors, oxynitride phosphors, nitride phosphors, sulfide phosphors, oxysulfide phosphors, or the like, which are widely used in light emitting diodes (LEDs), for example. Examples of oxide phosphors include yttrium, aluminum, and garnet-type YAG green to yellow light emitting phosphors containing cerium ions; terbium, aluminum, and garnet-type TAG yellow light emitting phosphors containing cerium ions, and silicate green to yellow light emitting phosphors containing cerium or europium ions. Examples of oxynitride phosphors include silicon, aluminum, oxygen, and nitrogen-type SiAlON red to green light emitting phosphors containing europium ions. Examples of nitride phosphors include calcium, strontium, aluminum, silicon, and nitrogen-type CASN red light emitting phosphors containing europium ions. Examples of sulfide phosphors include ZnS green light emitting phosphors containing copper ions or aluminum ions. Examples of oxysulfide phosphors include $Y_2O_2S$ red light emitting phosphors containing europium ions. These phosphors may be used as one type or as a mixture of two or more types.

In the present composition, the content of component (D) is from 0.1 to 70 mass %, and preferably from 1 to 20 mass %, relative to the total amount of components (A) to (E).

Component (E) is a hydrosilylation reaction catalyst for accelerating the curing of the present composition, examples of which include platinum-based catalysts, rhodium-based catalysts, and palladium-based catalysts. In particular, component (E) is preferably a platinum-based catalyst so that the curing of the present composition can be dramatically accelerated. Examples of the platinum-based catalyst include a platinum fine powder, chloroplatinic acid, an alcohol solution of chloroplatinic acid, a platinum-alkenylsiloxane complex, a platinum-olefin complex, and a platinum-carbonyl complex, with a platinum-alkenylsiloxane complex being preferred.

In addition, the content of component (E) in the present composition is an effective amount for accelerating curing of the present composition. Specifically, in order to satisfactorily cure the present composition, the content of component (E) is preferably an amount whereby the content of catalytic metal in component (E) relative to the present composition is from 0.01 to 500 ppm, more preferably from 0.01 to 100 ppm, and particularly preferably from 0.01 to 50 ppm in terms of mass units.

This composition may also contain (F) an adhesion-imparting agent in order to improve the adhesiveness of the cured product with respect to the substrate with which the composition makes contact during the course of curing. Component (F) is preferably an organosilicon compound having at least one alkoxy group bonded to a silicon atom in a molecule. This alkoxy group is exemplified by a methoxy group, an ethoxy group, a propoxy group, a butoxy group, and a methoxyethoxy group; and the methoxy group is particularly preferred. Moreover, non-alkoxy groups bonded to a silicon atom of this organosilicon compound are exemplified by substituted or non-substituted monovalent hydrocarbon groups such as alkyl groups, alkenyl groups, aryl groups, aralkyl groups, halogenated alkyl groups and the like; epoxy group-containing monovalent organic groups such as glycidoxyalkyl groups (such as a 3-glycidoxypropyl group, a 4-glycidoxybutyl group, and the like), epoxycyclohexylalkyl groups (such as a 2-(3,4-epoxycyclohexyl)ethyl group, a 3-(3,4-epoxycyclohexyl)propyl group, and the like) and oxiranylalkyl groups (such as a 4-oxiranylbutyl group, an 8-oxiranyloctyl group, and the like); acrylic group-containing monovalent organic groups such as a 3-methacryloxypropyl group and the like; and a hydrogen atom. This organosilicon compound preferably has a silicon-bonded alkenyl group or silicon-bonded hydrogen atom. Moreover, due to the ability to impart good adhesion with respect to various types of substrates, this organosilicon compound preferably has at least one epoxy group-containing monovalent organic group in a molecule. This type of organosilicon compound is exemplified by organosilane compounds, organosiloxane oligomers and alkyl silicates. Molecular structure of the organosiloxane oligomer or alkyl silicate is exemplified by a linear structure, partially branched linear structure, branched chain structure, ring-shaped structure, and net-shaped structure. A linear chain structure, branched chain structure, and net-shaped structure are particularly preferred. This type of organosilicon compound is exemplified by silane compounds such as 3-glycidoxypropyltrimethoxysilane, 2-(3,4-epoxycyclohexyl)ethyltrimethoxysilane, 3-methacryloxypropyltrimethoxysilane, and the like; siloxane compounds having at least one of silicon-bonded alkenyl groups and silicon-bonded hydrogen atoms, and at least one silicon-bonded alkoxy group in a molecule; mixtures of a silane compound or siloxane compound having at least one silicon-bonded alkoxy group and a siloxane compound having at least one silicon-bonded hydroxyl group and at least one silicon-bonded alkenyl group in a molecule; and methyl polysilicate, ethyl polysilicate, and epoxy group-containing ethyl polysilicate.

The content of component (F) in the present composition is not particularly limited but is preferably in the range of 0.01 to 10 parts by mass with respect to a total of 100 parts by mass of components (A) to (E) described above so as to ensure favorable adhesion to the substrate with which the composition makes contact during the course of curing.

The present composition may contain an organohydrogenpolysiloxane other than component (C) as long as the objective of the present invention is not impaired. This type of organohydrogenpolysiloxane is exemplified by a methylhydrogenpolysiloxane capped at both molecular terminals with trimethylsiloxy groups, a copolymer of dimethylsiloxane and methylhydrogensiloxane capped at both molecular terminals with trimethylsiloxy groups, a copolymer of dimethylsiloxane, methylhydrogensiloxane, and methylphenylsiloxane capped at both molecular terminals with trimethylsiloxy groups, a dimethylpolysiloxane capped at both molecular terminals with dimethylhydrogensiloxy groups, a copolymer of dimethylsiloxane and methylphenylsiloxane capped at both molecular terminals with dimethylhydrogensiloxy groups, a methylphenylpolysiloxane capped at both molecular terminals with dimethylhydrogensiloxy groups, an organopolysiloxane copolymer composed of siloxane units represented by the general formula $R'_3SiO_{1/2}$, siloxane units represented by the general formula $R'_2HSiO_{1/2}$ and siloxane units represented by the formula $SiO_{4/2}$, an organopolysiloxane copolymer composed of siloxane units represented by the general formula $R'_2HSiO_{1/2}$ and siloxane units represented by the formula $SiO_{4/2}$, an organopolysiloxane copolymer composed of siloxane units represented by the general formula $R'HSiO_{2/2}$ and siloxane units represented by the general formula $R'SiO_{3/2}$ or siloxane units represented by the formula $HSiO_{3/2}$, and a mixtures of two or more such organopolysiloxanes. Moreover, $R^1$ is an alkyl group having from 1 to 12 carbons, an aryl group having from 6 to 20 carbons, an aralkyl group having from 7 to 20 carbons, or a halogenated alkyl group having from 1 to 12 carbons. Examples of the alkyl group for R' include methyl groups, ethyl groups, propyl groups, butyl groups, pentyl groups, hexyl groups, heptyl groups, octyl groups, nonyl groups, decyl groups, undecyl groups, and dodecyl groups. In addition, examples of the aryl group for R' include phenyl groups, tolyl groups, xylyl groups, naphthyl groups, anthracenyl groups, phenanthryl groups, pyrenyl groups, and groups obtained by substituting hydrogen atoms in these aryl groups with alkyl groups such as methyl groups or ethyl groups; alkoxy groups such as methoxy groups or ethoxy groups; and halogen atoms such as chlorine atoms or bromine atoms. In addition, examples of the aralkyl group for R' include benzyl groups, phenethyl groups, naphthyl ethyl groups, naphthyl propyl groups, anthracenyl ethyl groups, phenanthryl ethyl groups, pyrenyl ethyl groups, and groups obtained by substituting hydrogen atoms in these aralkyl groups with alkyl groups such as methyl groups or ethyl groups; alkoxy groups such as methoxy groups or ethoxy groups; and halogen atoms such as chlorine atoms or bromine atoms. In addition, examples of the halogenated alkyl group for R' include chloromethyl groups and 3,3,3-trifluoropropyl groups.

A reaction inhibitor, for example, an alkyne alcohol such as 2-methyl-3-butyn-2-ol, 3,5-dimethyl-1-hexyn-3-ol and 2-phenyl-3-butyn-2-ol; an ene-yne compound such as 3-methyl-3-penten-1-yne and 3,5-dimethyl-3-hexen-1-yne; or 1,3,5,7-tetramethyl-1,3,5,7-tetravinylcyclotetrasiloxane, 1,3,5,7-tetramethyl-1,3,5,7-tetrahexenylcyclotetrasiloxane or a benzotriazole may be incorporated as an optional component in the present composition. The content of the reaction inhibitor in this composition is not particularly limited but is preferably in the range of 0.0001 to 5 parts by mass with respect to a total of 100 parts by mass of components (A) to (C) described above.

Moreover, an inorganic filler such as silica, glass, alumina or zinc oxide; an organic resin fine powder of a polymethacrylate resin and the like; a heat-resistant agent, a dye, a pigment, a flame retardant, a solvent and the like may be incorporated as optional components in the present composition at levels that do not impair the objective of the present invention.

Of the components added as optional components, in order to sufficiently suppress the discoloration of the silver electrodes or the silver plating of the substrate in the optical semiconductor device due to sulfur-containing gas in the air, it is possible to add at least one type of a fine powder having an average particle size from 0.1 nm to 5 µm selected from a group comprising zinc oxide fine powders surface-coated with at least one type of oxide of an element selected from a group comprising Al, Ag, Cu, Fe, Sb, Si, Sn, Ti, Zr, and rare earth elements; zinc oxide fine powders surface-treated with organosilicon compounds not having alkenyl groups; and hydrate fine powders of zinc carbonate.

In a zinc oxide fine powder surface-coated with an oxide, examples of rare earth elements include yttrium, cerium, and europium. Examples of oxides on the surface of the zinc oxide powder include $Al_2O_3$, $AgO$, $Ag_2O$, $Ag_2O_3$, $CuO$, $Cu_2O$, $FeO$, $Fe_2O_3$, $Fe_3O_4$, $Sb_2O_3$, $SiO_2$, $SnO_2$, $Ti_2O_3$, $TiO_2$, $Ti_3O_5$, $ZrO_2$, $Y_2O_3$, $CeO_2$, $Eu_2O_3$, and mixtures of two or more types of these oxides.

In a zinc oxide powder surface-treated with an organosilicon compound, the organosilicon compound does not have alkenyl groups, and examples include organosilanes, organosilazanes, polymethylsiloxanes, organohydrogenpolysiloxanes, and organosiloxane oligomers. Specific examples include organochlorosilanes such as trimethylchlorosilane, dimethylchlorosilane, and methyltrichlorosilane; organotrialkoxysilanes such as methyltrimethoxysilane, methyltriethoxysilane, phenyltrimethoxysilane, ethyltrimethoxysilane, n-propyltrimethoxysilane, and γ-methacryloxypropyltrimethoxysilane; diorganodialkoxysilanes such as dimethyldimethoxysilane, dimethyldiethoxysilane, and diphenyldimethoxysilane; triorganoalkoxysilanes such as trimethylmethoxysilane and trimethylethoxysilane; partial condensates of these organoalkoxysilanes; organosilazanes such as hexamethyldisilazane; a polymethylsiloxane, an organohydrogenpolysiloxane, an organosiloxane oligomer having a silanol group or an alkoxy group, and a resin-like organopolysiloxanes consisting of an $R^8SiO_{3/2}$ unit (wherein $R^8$ is a monovalent hydrocarbon group excluding alkenyl groups, examples of which include alkyl groups such as methyl groups, ethyl groups, or propyl groups; and aryl groups such as phenyl groups) or an $SiO_{4/2}$ unit, and having a silanol group or an alkoxy group.

A hydrate fine powder of zinc carbonate is a compound in which water bonds to zinc carbonate, and a preferable compound is one in which the rate of weight decrease is at least 0.1 wt. % under heating conditions at 105° C. for 3 hours.

The content of the zinc oxide is an amount in a range from 1 ppm to 10% and preferably an amount in a range from 1 ppm to 5% of the composition in terms of mass units. This is because when the content of the component is greater than or equal to the lower limit of the range described above, the discoloration of the silver electrodes or the silver plating of the substrate in the optical semiconductor device due to a sulfur-containing gas is sufficiently suppressed, and when the content is less than or equal to the upper limit of the range described above, the fluidity of the resulting composition is not diminished.

In addition, the composition may also contain a triazole-based compound as an optional component to enable the further suppression of the discoloration of the silver electrodes or the silver plating of the substrate due to a sulfur-containing gas in the air. Examples of such components include 1H-1,2,3-triazole, 2H-1,2,3-triazole, 1H-1,2,4-triazole, 4H-1,2,4-triazole, 2-(2'-hydroxy-5'-methylphenyl)benzotriazole, 1H-1,2,3-triazole, 2H-1,2,3-triazole, 1H-1,2,4-triazole, 4H-1,2,4-triazole, benzotriazole, tolyltriazole, carboxybenzotriazole, 1H-benzotriazole-5-methylcarboxylate, 3-amino-1,2,4-triazole, 4-amino-1,2,4-triazole, 5-amino-1,2,4-triazole, 3-mercapto-1,2,4-triazole, chlorobenzotriazole, nitrobenzotriazole, aminobenzotriazole, cyclohexano[1,2-d]triazole, 4,5,6,7-tetrahydroxytolyltriazole, 1-hydroxybenzotriazole, ethylbenzotriazole, naphthotriazole, 1-N,N-bis(2-ethylhexyl)-[(1,2,4-triazole-1-yl)methyl]amine, 1-[N,N-bis(2-ethylhexyl)aminomethyl]benzotriazole, 1-[N,N-bis(2-ethylhexyl)aminomethyl]tolyltriazole, 1-[N,N-bis(2-ethylhexyl)aminomethyl]carboxybenzotriazole, 1-[N,N-bis(2-hydroxyethyl)-aminomethyl]benzotriazole, 1-[N,N-bis(2-hydroxyethyl)-aminomethyl]tolyltriazole, 1-[N,N-bis(2-hydroxyethyl)-aminomethyl]carboxybenzotriazole, 1-[N,N-bis(2-hydroxypropyl)aminomethyl]carboxybenzotriazole, 1-[N,N-bis(1-butyl)aminomethyl]carboxybenzotriazole, 1-[N,N-bis(1-octyl)aminomethyl]carboxybenzotriazole, 1-(2',3'-dihydroxypropyl)benzotriazole, 142%3'-di-carboxyethyl)benzotriazole, 2-(2'-hydroxy-3',5'-di-tert-butylphenyl)benzotriazole, 2-(2'-hydroxy-3',5'-amylphenyl)benzotriazole, 2-(T-hydroxy-4'-octoxyphenyl)benzotriazole, 2-(2'-hydroxy-5'-tert-butylphenyl)benzotriazole, 1-hydroxybenzotriazole-6-carboxylic acid, 1-oleoylbenzotriazole, 1,2,4-triazol-3-ol, 5-amino-3-mercapto-1,2,4-triazole, 5-amino-1,2,4-triazole-3-carboxylic acid, 1,2,4-triazole-3-carboxyamide, 4-aminourazole, and 1,2,4-triazol-5-one. The content of this benzotriazole compound is not particularly limited but is an amount in a range from 0.01 ppm to 3% and preferably in a range from 0.1 ppm to 1% of the composition in terms of mass units.

The present composition is such that curing occurs either at room temperature or under heating, but it is preferable to heat the composition in order to achieve rapid curing. The heating temperature is preferably from 50 to 200° C.

The cured product of the present invention will now be described in detail.

The cured product of the present invention is formed by curing the aforementioned curable silicone composition. The shape of the cured product is not particularly limited, and examples include a sheet shape and a film shape. The cured product can be handled as a simple substance or may also be handled in a state in which the cured product covers or seals an optical semiconductor element or the like.

The optical semiconductor device of the present invention will now be explained in detail.

The optical semiconductor device of the present invention is produced by sealing an optical semiconductor element with a cured product of the curable silicone composition described above. Examples of such an optical semiconductor device of the present invention include a light emitting diode (LED), a photocoupler, and a CCD. Examples of optical semiconductor elements include light emitting diode (LED) chips and solid-state image sensing devices.

FIG. 1 illustrates a cross-sectional view of a single surface mounted type LED, which is one example of the optical semiconductor device of the present invention. In the LED illustrated in FIG. 1, a light emitting element (an LED chip) 1 is die-bonded to a lead frame 2, and the light emitting element (LED chip) 1 and a lead frame 3 are wire-bonded by a bonding wire 4. A casing material 5 is provided around the light emitting element (LED chip) 1, and the light emitting element (LED chip) 1 inside the casing material 5 is sealed by a cured product 6 of the curable silicone composition of the present invention.

An example of a method of producing the surface mounted type LED illustrated in FIG. 1 is a method of die-bonding the light emitting element (LED chip) 1 to the lead frame 2, wire-bonding the light emitting element (LED chip) 1 and the lead frame 3 with a gold bonding wire 4, filling the inside of the casing material 5 provided around the light emitting element (LED chip) 1 with the curable silicone composition of the present invention, and then curing the composition by heating at 50 to 200° C.

EXAMPLES

The curable silicone composition, the cured product thereof, and the optical semiconductor device of the present invention will be described in detail hereinafter using Practical Examples. Moreover, in the formulae, Me, Vi, Ph, and Ep denote a methyl group, a vinyl group, a phenyl group, and a 3-glycidoxypropyl group, respectively.

Reference Example 1

First, 400 g (2.02 mol) of phenyltrimethoxysilane and 93.5 g (0.30 mol) of 1,3-divinyl-1,3-diphenyldimethyldisiloxane were loaded into a reaction vessel and mixed in advance. Next, 1.74 g (11.6 mmol) of trifluoromethane sulfonic acid was added, and 110 g (6.1 mol) of water was added and heat-refluxed for 2 hours while stirring. Next, the mixture was distilled at atmospheric pressure by heating until the temperature reached 85° C. Next, 89 g of toluene and 1.18 g (21.1 mmol) of potassium hydroxide were added, and the mixture was distilled at atmospheric pressure by heating until the reaction temperature reached 120° C. and then allowed to react at this temperature for 6 hours. The mixture was then cooled to room temperature, and neutralization was carried out by adding 0.68 g (11.4 mmol) of acetic acid. The produced salt was filtered, and low boiling point substances were removed from the obtained transparent solution by heating under reduced pressure, thereby producing 347 g (yield: 98%) of an organopolysiloxane resin represented by the average unit formula:

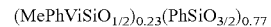

$(MePhViSiO_{1/2})_{0.23}(PhSiO_{3/2})_{0.77}$

Reference Example 2

100 g (0.233 moles) of methylphenylpolysiloxane represented by the formula:

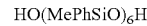

$HO(MePhSiO)_6H$ 100 g of toluene and 29.7 g (0.294 moles) of triethylamine were placed in a reaction vessel, and 59.9 g (0.245 moles) of vinyldiphenylchlorosilane was added while stirring. After the mixture was stirred for 1 hour at room temperature, the mixture was heated to 50° C. and stirred for 3 hours. Next, 0.38 g of methanol was added, and water was then added. After the mixture was washed with water, low-boiling-point substances were distilled out of the organic layer by heating under reduced pressure, thereby producing a colorless, clear organopolysiloxane (viscosity: 447.5 mPa·s, refractive index: 1.567) represented by the formula:

Ph$_2$ViSiO(MePhSiO)$_6$SiPh$_2$Vi

Reference Example 3

First, 82.2 g of 1,3-divinyl-1,1,3,3-tetramethyldisiloxane, 143 g of water, 0.38 g of trifluoromethane sulfonic acid, and 500 g of toluene were loaded into a 4-necked flask with an agitator, a refluxing cooler, and a thermometer, and 524.7 g of phenyltrimethoxysilane was dripped into the mixture over the course of one hour while stirring. After dripping was complete, the mixture was heat-refluxed for one hour. The mixture was then cooled, and after the bottom layer was separated, the toluene solution layer was washed with water three times. Next, 314 g of methyl glycidoxypropyl dimethoxysilane, 130 g of water, and 0.50 g of potassium hydroxide were added to the water-washed toluene solution layer, and the mixture was heat-refluxed for one hour. Methanol was then distilled off, and the excess water was removed by azeotropic dehydration. After heat-refluxing for 4 hours, the toluene solution was cooled, neutralized with 0.55 g of acetic acid, and washed 3 times with water. After the water was removed, the toluene was distilled off under reduced pressure to prepare an adhesion-imparting agent with a viscosity of 8,500 mPa·s represented by the average unit formula:

(Me$_2$ViSiO$_{1/2}$)$_{0.18}$(PhSiO$_{3/2}$)$_{0.53}$(EpMeSiO$_{2/2}$)$_{0.29}$

Reference Example 4

40.0 g (0.045 moles) of a dimethylpolysiloxane represented by the formula:

HO(Me$_2$SiO)$_{12}$H 62.0 g of toluene and 10.9 g (0.107 mol) of triethylamine were placed in a reaction vessel, and 22.0 g (0.090 mol) of vinyl diphenyl chlorosilane was added while stirring. After the mixture was stirred for 1 hour at room temperature, the mixture was heated to 50° C. and stirred for 3 hours. Water was then added, and after washing with water, low boiling point substances were removed from the organic layer by heating under reduced pressure, thereby producing a colorless, clear organopolysiloxane (viscosity 36 mPa·s, refractive index 1.466) represented by the formula:

Ph$_2$ViSiO(Me$_2$SiO)$_{12}$SiPh$_2$Vi

Reference Example 5

10 g of the organopolysiloxane prepared in Reference Example 4, 2.81 g of a cyclic dimethylsiloxane, and 0.0013 g of potassium hydroxide were placed in a reaction vessel, heated, and allowed to react for 5 hours at 150° C. Following the reaction, neutralization was carried out by adding an appropriate amount of acetic acid. Low boiling point components were removed from the neutralized product under reduced pressure, and the neutralized product was then filtered to produce a colorless, clear organopolysiloxane (viscosity 35 mPa·s, refractive index 1.461) represented by the formula:

Ph$_2$ViSiO(Me$_2$SiO)$_{17}$SiPh$_2$Vi

Reference Example 6

10 g of the organopolysiloxane prepared in Reference Example 4, 5.61 g of a cyclic dimethylsiloxane, and 0.0016 g of potassium hydroxide were placed in a reaction vessel, heated, and allowed to react for 5 hours at 150° C. Following the reaction, neutralization was carried out by adding an appropriate amount of acetic acid. Low boiling point components were removed from the neutralized product under reduced pressure, and the neutralized product was then filtered to produce a colorless transparent organopolysiloxane (viscosity 39 mPa·s, refractive index 1.461) represented by the formula:

Ph$_2$ViSiO(Me$_2$SiO)$_{17}$SiPh$_2$Vi

Practical Examples 1 to 12 and Comparative Examples 1 to 3

The curable silicone compositions shown in Table 1 were prepared using the components mentioned below. Moreover, in Table 1, the content of component (E) is expressed in terms of the content (ppm in terms of mass units) of platinum metal relative to the curable silicone composition.

The following components were used as component (A).
Component (A-1): silicone resin represented by the average unit formula:

(Me$_2$ViSiO$_{1/2}$)$_{0.2}$(PhSiO$_{3/2}$)$_{0.8}$,

Component (A-2): organopolysiloxane resin prepared in Reference Example 1 and represented by the average unit formula:

(MePhViSiO$_{1/2}$)$_{0.23}$(PhSiO$_{3/2}$)$_{0.77}$

Component (A-3): compound represented by the average unit formula:

(Me$_2$ViSiO$_{1/2}$)$_4$(SiO$_{4/2}$)$_1$

Component (A-4): methylphenylpolysiloxane capped at both molecular terminals with dimethylvinylsiloxy groups and having a viscosity of 3,000 mPa·s
Component (A-5): organopolysiloxane prepared in Reference Example 2 and represented by the formula:

Ph$_2$ViSiO(MePhSiO)$_6$SiPh$_2$Vi

Component (A-6): organopolysiloxane represented by the average unit formula:

(Me$_2$ViSiO$_{1/2}$)$_{0.28}$(Me$_2$SiO$_{2/2}$)$_{0.72}$

The following components were used as component (B).
Component (B-1): organopolysiloxane prepared in Reference Example 4
Component (B-2): organopolysiloxane prepared in Reference Example 5
Component (B-3): organopolysiloxane prepared in Reference Example 6
The following components were used as component (C).
Component (C-1): organotrisiloxane represented by the formula:

HMe$_2$SiOPh$_2$SiOSiMe$_2$H

Component (C-2): silicone resin represented by the average unit formula:

(Me$_2$HSiO$_{1/2}$)$_{0.6}$(PhSiO$_{3/2}$)$_{0.4}$

The following components were used as component (D).
Component (D-1): TAG-based phosphor (NTAG 4851 manufactured by INTEMATIX)

Component (D-2): YAG-based phosphor (NYAG 4454 manufactured by INTEMATIX)
Component (D-3): silicate-based phosphor (EY 4453 manufactured by INTEMATIX)

The following component was used as the component (E).
Component (E-1): 1,3,5,7-tetramethyl-1,3,5,7-tetravinylcyclotetrasiloxane solution of a platinum-1,3-divinyl-1,1,3,3-tetramethyldisiloxane complex (the solution contains 0.1 mass % of platinum)

The following components were used as adhesion-imparting agents.
Component (F-1): adhesion-imparting agent prepared in Reference Example 3
Component (F-2): adhesion-imparting agent which has a viscosity at 25° C. of 30 mPa·s and which consists of a condensation reaction product of 3-glycidoxypropyltrimethoxysilane and a methylvinylsiloxane oligomer capped at both molecular terminals with silanol groups The following component was used as a reaction inhibitor.
Component (G-1): 1,3,5,7-tetramethyl-1,3,5,7-tetravinylcyclotetrasiloxane The following component was used as nanoparticles.
Component (H-1): alumina particles having an average particle diameter of 13 μm (Alu C805 manufactured by Nippon Aerosil)

Cured products of the curable silicone compositions prepared as described above were evaluated as follows.

[Preparation of Cured Products]

The curable silicone compositions shown in Table 1 were prepared, phosphors were added to these composition at the quantities (parts) shown in Table 1, stirred for 30 seconds, and then stirred for 2 minutes using an ARV-310 planetary centrifugal vacuum mixer manufactured by Thinky at an orbital speed of 1600 rpm, a rotational speed of 800 rpm, and a vacuum of 2 Pa. A phosphor-containing cured product was prepared by coating 0.5 g of the obtained phosphor-containing curable silicone composition on a glass plate (50 mm×50 mm×2 mm), placing the glass plate in a thermal cycling type oven, increasing the temperature from room temperature to 150° C. over a period of 30 minutes, holding the temperature at 150° C. for 1 hour, and then cooling to room temperature.

[Smoothness of Cured Product]

The smoothness of the cured product was evaluated by observing the surface of the cured product using a LEXT OLS4000 laser microscope manufactured by Olympus, and cases in which wrinkling occurred on the surface of the cured product were evaluated as "X", cases in which unevenness occurred on the surface of the cured product were evaluated as "Δ", cases in which wrinkling hardly occurred on the surface of the cured product were evaluated as "○", and cases in which wrinkling did not occur at all on the surface of the cured product were evaluated as "◎".

[Dispersibility of Fluorescent Substances]

The dispersibility of phosphors within the cured product was evaluated by visually observing a sample that had been coated and cured on a glass plate, and cases in which phosphors aggregated and formed a banded pattern were evaluated as "X", cases in which phosphors aggregated and formed an island-like pattern were evaluated as "Δ", cases in which phosphors hardly aggregated were evaluated as "○", and cases in which phosphors did not aggregate at all were evaluated as "◎".

TABLE 1

| | | Category Practical Examples | | | | | | | |
|---|---|---|---|---|---|---|---|---|---|
| | Item | 1 | 2 | 3 | 4 | 5 | 6 | 7 | 8 |
| Curable silicone composition (parts by mass) | Component (A-1) | 56.1 | 56.1 | 59.6 | 59.8 | 54.4 | 55.7 | 55.7 | 55.7 |
| | Component (A-2) | 0 | 0 | 0 | 0 | 0 | 0 | 0 | 0 |
| | Component (A-3) | 1.8 | 1.8 | 0 | 0 | 1.4 | 0 | 0 | 0 |
| | Component (A-4) | 15.4 | 13.4 | 7.4 | 2.1 | 19.4 | 12.8 | 16.7 | 13.5 |
| | Component (A-5) | 0 | 0 | 0 | 0 | 0 | 0 | 0 | 0 |
| | Component (A-6) | 0 | 0 | 0 | 0 | 0 | 0 | 0 | 0 |
| | Component (B-1) | 1.0 | 3.0 | 7.4 | 11.7 | 0.25 | 7.0 | 0 | 0 |
| | Component (B-2) | 0 | 0 | 0 | 0 | 0 | 0 | 5.0 | 0 |
| | Component (B-3) | 0 | 0 | 0 | 0 | 0 | 0 | 0 | 7.0 |
| | Component (C-1) | 22.7 | 22.7 | 22.5 | 23.3 | 21.8 | 21.8 | 19.9 | 21.1 |
| | Component (C-2) | 0 | 0 | 0 | 0 | 0 | 0 | 0 | 0 |
| | Component (D-1) | 3.5 | 3.5 | 3.5 | 3.5 | 3.5 | 3.5 | 3.5 | 3.5 |
| | Component (D-2) | 0 | 0 | 0 | 0 | 0 | 0 | 0 | 0 |
| | Component (D-3) | 0 | 0 | 0 | 0 | 0 | 0 | 0 | 0 |
| | Component (E-1)* | 5 | 5 | 5 | 5 | 5 | 5 | 5 | 5 |
| | Component (F-1) | 2.5 | 2.5 | 2.6 | 2.6 | 2.5 | 2.5 | 2.5 | 2.5 |
| | Component (F-2) | 0 | 0 | 0 | 0 | 0 | 0 | 0 | 0 |
| | Component (G-1) | 0.5 | 0.5 | 0.5 | 0.5 | 0.25 | 0.2 | 0.2 | 0.2 |
| | Component (H-1) | 0 | 0 | 0 | 0 | 0 | 0 | 0 | 0 |
| Viscosity of composition (Pa·s) | | 3.3 | 3.0 | 2.6 | 1.9 | 3.3 | 2.7 | 2.9 | 2.8 |
| Smoothness of cured product | | ◎ | ◎ | ◎ | ◎ | ◎ | ◎ | ◎ | ◎ |
| Dispersibility of phosphors | | ○ | ○ | ◎ | ◎ | ○ | ◎ | ◎ | ◎ |

TABLE 1-continued

| | | Practical Examples | | | | Comparative Examples | | |
|---|---|---|---|---|---|---|---|---|
| Item | | 9 | 10 | 11 | 12 | 1 | 2 | 3 |
| Curable silicone composition (parts by mass) | Component (A-1) | 55.2 | 55.2 | 0 | 0 | 54.7 | 56.1 | 0 |
| | Component (A-2) | 0 | 0 | 59.5 | 59.3 | 0 | 0 | 63.0 |
| | Component (A-3) | 1.8 | 1.8 | 0 | 0 | 1.8 | 1.8 | 0 |
| | Component (A-4) | 13.5 | 13.5 | 9 | 0 | 12.1 | 16.4 | 14.0 |
| | Component (A-5) | 0 | 0 | 0 | 8 | 0 | 0 | 0 |
| | Component (A-6) | 0 | 0 | 0 | 0 | 6.2 | 0 | 0 |
| | Component (B-1) | 7.0 | 7.0 | 5.0 | 5.0 | 0 | 0 | 0 |
| | Component (B-2) | 0 | 0 | 0 | 0 | 0 | 0 | 0 |
| | Component (B-3) | 0 | 0 | 0 | 0 | 0 | 0 | 0 |
| | Component (C-1) | 21.5 | 21.5 | 20.4 | 21.8 | 0 | 22.7 | 20.0 |
| | Component (C-2) | 1.5 | 1.5 | 0 | 0 | 22.2 | 0 | 0 |
| | Component (D-1) | 0 | 0 | 3.5 | 3.5 | 3.5 | 3.5 | 3.5 |
| | Component (D-2) | 3.8 | 0 | 0 | 0 | 0 | 0 | 0 |
| | Component (D-3) | 0 | 8.0 | 0 | 0 | 0 | 0 | 0 |
| | Component (E-1)* | 5 | 5 | 5 | 5 | 5 | 5 | 5 |
| | Component (F-1) | 2.5 | 2.5 | 2.4 | 2.4 | 2.5 | 2.5 | 2.5 |
| | Component (F-2) | 0 | 0 | 0.5 | 0.5 | 0 | 0 | 0 |
| | Component (G-1) | 0.5 | 0.5 | 0.2 | 0.2 | 0.5 | 0.5 | 0.2 |
| | Component (H-1) | 0 | 0 | 3.0 | 3.0 | 0 | 0 | 3.0 |
| Viscosity of composition (Pa · s) | | 2.6 | 2.6 | 2.3 | 1.2 | 2.4 | 3.4 | 2.9 |
| Smoothness of cured product | | ◎ | ◎ | ◎ | ◎ | X | Δ | Δ |
| Dispersibility of phosphors | | ◎ | ◎ | ◎ | ◎ | X | Δ | Δ |

Practical Example 13

8 g of the curable phosphor-containing silicone compositions prepared in Practical Example 8 and Comparative Example 1, which are shown in Table 1, were each placed in 10 mL syringes manufactured by Musashi, 5.4 μL of the curable phosphor-containing silicone composition was coated on each of 18 LEDs (5730 LEDs manufactured by I-Chiun Industry) using a dispenser and 200 times of trial coating were conducted on an aluminum plate with 5.4 μL of the curable phosphor-containing silicone composition, after which 5.4 μL of the curable phosphor-containing silicone composition was coated on each of 18 LEDs and 200 times of trial coating were conducted on an aluminum plate with 5.4 μL of the curable phosphor-containing silicone composition, after which 5.4 μL of the curable phosphor-containing silicone composition was coated on each of 18 LEDs and 200 times of trial coating were conducted on an aluminum plate with 5.4 μL of the curable phosphor-containing silicone composition, after which 5.4 μL of the curable phosphor-containing silicone composition was coated on each of 18 LEDs, meaning that a total of 72 LEDs were coated. LEDs sealed with phosphor-containing silicone cured products were obtained by placing the obtained LEDs in a thermal cycling type oven, increasing the temperature from room temperature to 150° C. over a period of 30 minutes, holding the temperature at 150° C. for 1 hour, and then cooling to room temperature. Using an ISP 250 integrating sphere manufactured by Instrument Systems and a CAS-140CT spectrometer, each LED was measured at a current of 60 mA, and the y-axis variation width of CIE coordinates obtained from the measurements results from the 72 LEDs was investigated. The y-axis variation width in Practical Example 8 was 0.012. Meanwhile, the y-axis variation width for the curable silicone composition of Comparative Example 1 was 0.02, thereby confirming that the composition of Practical Example 8 showed a 40% improvement in variation.

INDUSTRIAL APPLICABILITY

The curable silicone composition of the present invention is a composition which has excellent fluidity and which is cured to form a cured product in which phosphors are homogeneously dispersed and which has a high refractive index, and is therefore suitable for use as a sealing agent or coating agent for light emitting elements in optical semiconductor device's such as light emitting diodes (LEDs).

DESCRIPTION OF SYMBOLS

1 Light emitting element
2 Lead frame
3 Lead frame
4 Bonding wire
5 Casing material
6 Cured product of the curable silicone composition

The invention claimed is:
1. A curable silicone composition comprising:
(A) an organopolysiloxane having at least two alkenyl groups in a molecule, and excluding component (B) mentioned below;
(B) an organopolysiloxane represented by the general formula:

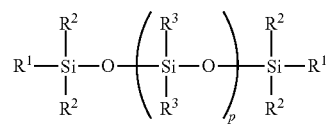

wherein, $R^1$ are the same or different and are each an alkenyl group having from 2 to 12 carbons, $R^2$ are the same or different and are each an aryl group having from 6 to 20 carbons or an aralkyl group having from 7 to 20 carbons, $R^3$ are the same or different and are each an alkyl group having from 1 to 12 carbons, and p is an integer from 1 to 100;

(C) an organopolysiloxane having at least two silicon-bonded hydrogen atoms in a molecule, in an amount that the amount of silicon-bonded hydrogen atoms in component (C) is from 0.1 to 5 moles per 1 mol of total alkenyl groups in components (A) and (B);

(D) a phosphor; and (E) an effective amount of a hydrosilylation reaction catalyst;

the content of component (A) being from 20 to 80 mass %, the content of component (B) being from 0.1 to 20 mass % and the content of component (D) being from 0.1 to 70 mass %, each relative to the total amount of components (A) to (E).

2. The curable silicone composition according to claim 1, wherein component (A) is ($A_1$) an organopolysiloxane which has at least two alkenyl groups in a molecule and which is represented by the average unit formula:

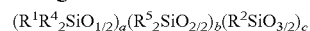
$(R^1R^4{}_2SiO_{1/2})_a(R^5{}_2SiO_{2/2})_b(R^2SiO_{3/2})_c$ wherein, $R^1$ is an alkenyl group having from 2 to 12 carbons, $R^2$ is an aryl group having from 6 to 20 carbons or an aralkyl group having from 7 to 20 carbons, $R^4$ are the same or different and are each an alkyl group having from 1 to 12 carbons, an alkenyl group having from 2 to 12 carbons, an aryl group having from 6 to 20 carbons, or an aralkyl group having from 7 to 20 carbons, $R^5$ are the same or different and are each an alkyl group having from 1 to 12 carbons, an alkenyl group having from 2 to 12 carbons, or a phenyl group, and a, b, and c are numbers that satisfy such that $0.01 \le a \le 0.5$, $0 \le b \le 0.7$, $0.1 \le c < 0.9$, and $a+b+c=1$, or a mixture of component ($A_1$) and ($A_2$) an organopolysiloxane represented by the general formula:

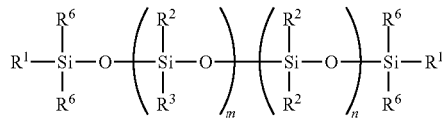

wherein, $R^1$ and $R^2$ are synonymous with the groups described above, $R^3$ is an alkyl group having from 1 to 12 carbons, $R^6$ are the same or different and are each an alkyl group having from 1 to 12 carbons, an aryl group having from 6 to 20 carbons, or an aralkyl group having from 7 to 20 carbons, m is an integer from 1 to 100, and n is an integer from 0 to 50, where m≥n and 1≤m+n≤100, in the content of component ($A_2$) is at most 50 mass % relative to the total amount of components (A) to (E).

3. The curable silicone composition according to claim 1, wherein component (C) is ($C_1$) an organopolysiloxane represented by the general formula:

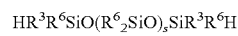
$HR^3R^6SiO(R^6{}_2SiO)_sSiR^3R^6H$ wherein, $R^3$ are the same or different and are each an alkyl group having from 1 to 12 carbons, $R^6$ are the same or different and are each an alkyl group having from 1 to 12 carbons, an aryl group having from 6 to 20 carbons, or an aralkyl group having from 7 to 20 carbons, and s is an integer from 0 to 100, ($C_2$) an organopolysiloxane having at least two silicon-bonded hydrogen atoms in a molecule, which is represented by the average unit formula:

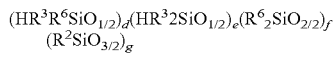
$(HR^3R^6SiO_{1/2})_d(HR^3{}_2SiO_{1/2})_e(R^6{}_2SiO_{2/2})_f(R^2SiO_{3/2})_g$ wherein, $R^2$ is an aryl group having from 6 to 20 carbons or an aralkyl group having from 7 to 20 carbons, $R^3$ and $R^6$ are synonymous with the groups described above, and d, e, f, and g are numbers that satisfy such that $0.01 \le d \le 0.7$, $0 \le e \le 0.5$, $0 \le f \le 0.7$, $0.1 \le g < 0.9$, and $d+e+f+g=1$, or a mixture of components ($C_1$) and ($C_2$).

4. The curable silicone composition according to claim 2, wherein $R^2$ in component ($A_1$) is a phenyl group or a naphthyl group.

5. The curable silicone composition according to claim 1, wherein $R^2$ in component (B) is a phenyl group or a naphthyl group.

6. The curable silicone composition according to claim 3, wherein at least one $R^6$ in component ($C_1$) is a phenyl group or a naphthyl group.

7. The curable silicone composition according to claim 3, wherein $R^2$ in component ($C_2$) is a phenyl group or a naphthyl group.

8. The curable silicone composition according to claim 3, wherein in the mixture of components ($C_1$) and ($C_2$), the mass ratio of component ($C_1$) and component ($C_2$) is from 0.5:9.5 to 9.5:0.5.

9. The curable silicone composition according to claim 1, further comprising (F) an adhesion-imparting agent in an amount of 0.01 to 10 parts by mass per 100 parts total mass of components (A) to (E).

10. A cured product produced by curing the curable silicone composition of claim 1.

11. An optical semiconductor device comprising a light emitting element sealed or coated with a cured product of the curable silicone composition described in claim 1.

12. The curable silicone composition according to claim 2, wherein component (C) is ($C_1$) an organopolysiloxane represented by the general formula:

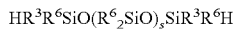
$HR^3R^6SiO(R^6{}_2SiO)_sSiR^3R^6H$ wherein, $R^3$ are the same or different and are each an alkyl group having from 1 to 12 carbons, $R^6$ are the same or different and are each an alkyl group having from 1 to 12 carbons, an aryl group having from 6 to 20 carbons, or an aralkyl group having from 7 to 20 carbons, and s is an integer from 0 to 100, ($C_2$) an organopolysiloxane having at least two silicon-bonded hydrogen atoms in a molecule, which is represented by the average unit formula:

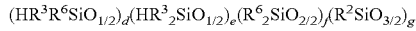
$(HR^3R^6SiO_{1/2})_d(HR^3{}_2SiO_{1/2})_e(R^6{}_2SiO_{2/2})_f(R^2SiO_{3/2})_g$ wherein, $R^2$ is an aryl group having from 6 to 20 carbons or an aralkyl group having from 7 to 20 carbons, $R^3$ and $R^6$ are synonymous with the groups described above, and d, e, f, and g are numbers that satisfy such that $0.01 \le d \le 0.7$, $0 \le e \le 0.5$, $0 \le f \le 0.7$, $0.1 \le g < 0.9$, and $d+e+f+g=1$, or a mixture of components ($C_1$) and ($C_2$).

13. The curable silicone composition according to claim 2, wherein $R^2$ in component (B) is a phenyl group or a naphthyl group.

14. The curable silicone composition according to claim 3, wherein $R^2$ in component (B) is a phenyl group or a naphthyl group.

15. The curable silicone composition according to claim 4, wherein $R^2$ in component (B) is a phenyl group or a naphthyl group.

* * * * *